(12) United States Patent
Wang et al.

(10) Patent No.: US 10,996,410 B2
(45) Date of Patent: *May 4, 2021

(54) METHODS OF FORMING SEMICONDUCTOR PACKAGES

(71) Applicant: Taiwan Semiconductor Manufacturing Co., Ltd., Hsinchu (TW)

(72) Inventors: Chuei-Tang Wang, Taichung (TW); Jeng-Shien Hsieh, Kaohsiung (TW); Hsing-Kuo Hsia, Hsinchu County (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/686,224

(22) Filed: Nov. 18, 2019

(65) Prior Publication Data

US 2020/0088960 A1    Mar. 19, 2020

Related U.S. Application Data

(63) Continuation of application No. 16/224,801, filed on Dec. 19, 2018, now Pat. No. 10,481,351, which is a continuation of application No. 15/660,972, filed on Jul. 27, 2017, now Pat. No. 10,162,139.

(51) Int. Cl.
  *G02B 6/12*   (2006.01)
  *G02B 6/42*   (2006.01)
  *G02B 6/122*  (2006.01)

(52) U.S. Cl.
  CPC .......... *G02B 6/4246* (2013.01); *G02B 6/122* (2013.01); *G02B 6/12004* (2013.01); *G02B 6/428* (2013.01); *G02B 6/4214* (2013.01); *G02B 2006/12121* (2013.01)

(58) Field of Classification Search
  CPC .............. G02B 6/4214; G02B 6/12004; G02B 6/4246; G02B 6/122; G02B 6/428; G02B 6/12; G02B 2006/12121
  See application file for complete search history.

(56) References Cited

U.S. PATENT DOCUMENTS 10,162,139 B1 * 12/2018 Wang ................ G02B 6/12004
10,481,351 B2 * 11/2019 Wang .................. G02B 6/4246

* cited by examiner

*Primary Examiner* — Jennifer Doan
(74) *Attorney, Agent, or Firm* — JCIPRNET

(57) ABSTRACT

Semiconductor packages are provided. The semiconductor package includes a photonic integrated circuit, an electronic integrated circuit and a high performance integrated circuit. The electronic integrated circuit is disposed aside the photonic integrated circuit and electrically connected to the photonic integrated circuit through a first redistribution structure. The high performance integrated circuit is disposed aside the electronic integrated circuit and electrically connected to the electronic integrated circuit through a second redistribution structure.

20 Claims, 20 Drawing Sheets

METHODS OF FORMING SEMICONDUCTOR PACKAGES

CROSS-REFERENCE TO RELATED APPLICATION

This is a continuation application of and claims priority benefit of U.S. application Ser. No. 16/224,801, filed on Dec. 19, 2018 and now allowed, which is a continuation application of and claims priority benefit of U.S. application Ser. No. 15/660,972, filed on Jul. 27, 2017. The entirety of the above-mentioned patent applications is hereby incorporated by reference herein and made a part of this specification.

BACKGROUND

Optical signals are usable for high speed and secure data transmission between two devices. In some applications, a device capable of optical data transmission includes at least an integrated circuit (IC or "chip") having a laser die for transmitting and/or receiving optical signals. Also, the device usually has one or more other optical or electrical components, a waveguide for the transmission of the optical signals, and a support, such as a substrate of a printed circuit board, on which the chip equipped with the laser die and the one or more other components are mounted. Various approaches for mounting a chip equipped with a laser die on a substrate have been studied.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
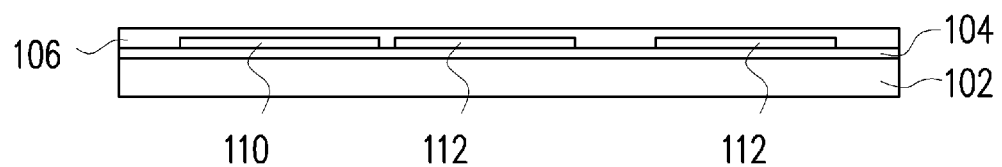
FIG. 1A to FIG. 1D are schematic cross sectional views of various stages in a manufacturing method of a photonic integrated circuit ("PIC") according to some exemplary embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1D are schematic cross sectional views of various stages in a manufacturing method of a photonic integrated circuit ("PIC") according to some exemplary embodiments. FIG. 2A to FIG. 2D are schematic top views of various stages in a manufacturing method of a photonic integrated circuit according to some exemplary embodiments.

Figure 2A:
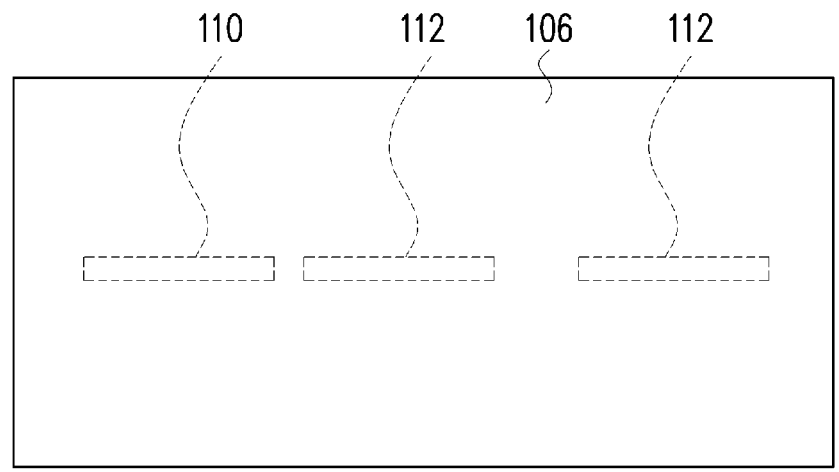
FIG. 2A to FIG. 2D are schematic top views of various stages in a manufacturing method of a photonic integrated circuit according to some exemplary embodiments.

Referring to FIGS. 1A and 2A, optical modulator 110 and waveguides 112 are formed over a substrate 102. In some embodiments, the substrate 102 is a bulk silicon substrate, however, other substrate materials may be used to suit particular circumstances. In some embodiments, a buried oxide layer 104 is formed over the substrate 102 to form an SOI (Silicon on Insulator) structure, and the optical modulator 110 and the waveguides 112 are formed over the buried oxide layer 104. In some embodiments, a cladding layer 106 is disposed between the waveguides 112. In some embodiments, a material of the optical modulator 110 and the waveguides 112 are silicon, SiON, or other suitable material.

In some embodiments, the optical modulator 110 and the waveguides 112 are disposed side by side over the substrate 102, and the optical modulator 110 is disposed adjacent to an edge of the substrate 102, for example.

Figure 1B:
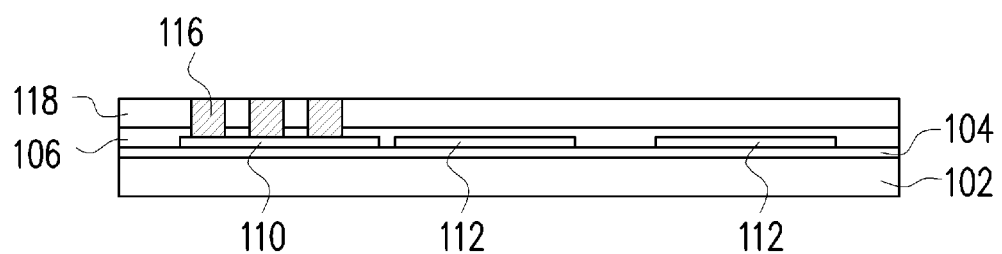
Figure 2B:
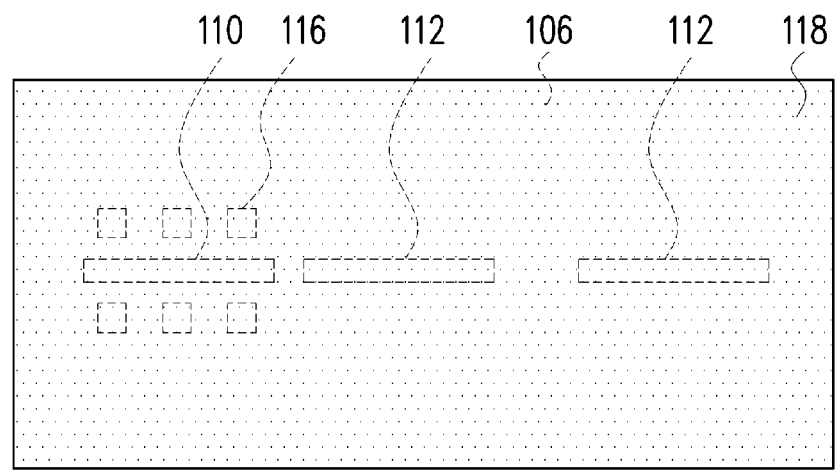

Referring to FIGS. 1B and 2B, vias 116 are formed over the substrate 102. In some embodiments, a material of the vias 116 may be metal such as aluminum, copper, gold, a combination thereof or other suitable material.

Then, a passivation layer 118 is formed over the substrate 102, the vias 116 are disposed in the passivation layer 118, and the passivation layer 118 is disposed over the waveguides 112. In some embodiments, a material of the passivation layer 118 is silicon oxide, silicon nitride, low-k dielectric materials such as carbon doped oxides, extremely low-k dielectric materials such as porous carbon doped silicon dioxide, a combination thereof or other suitable material. In some embodiments, a method of forming the passivation layer 118 includes a deposition process such as a chemical vapor deposition process or other suitable deposition process.

Figure 1C:
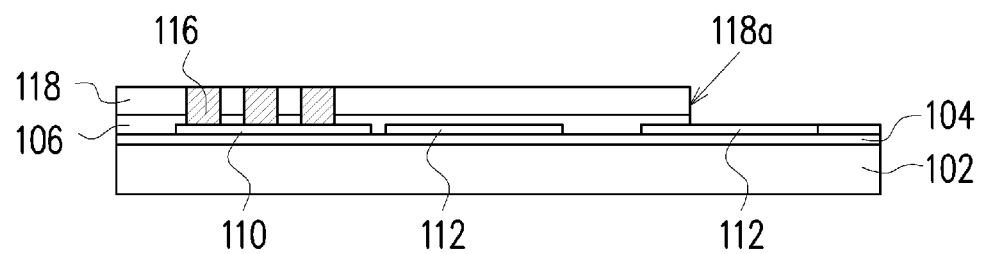
Figure 2C:
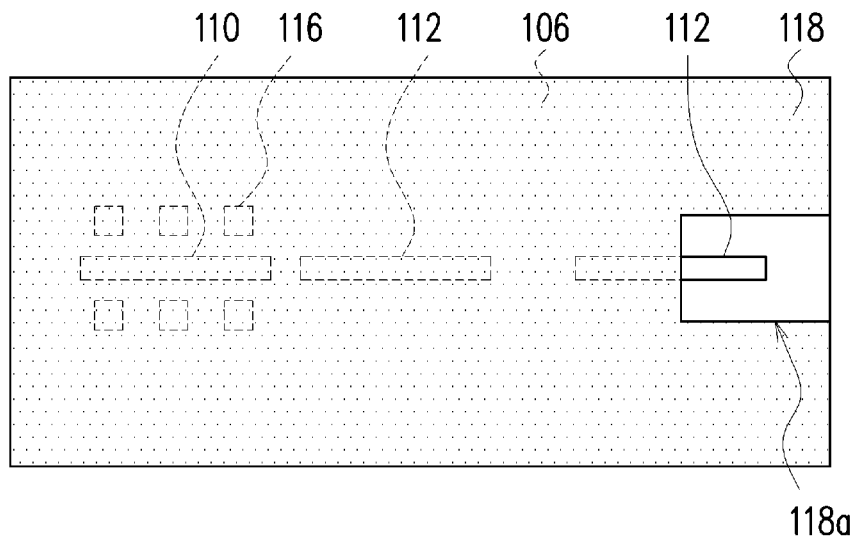

Referring to FIGS. 1C and 2C, the passivation layer 118 is patterned to form an opening 118a at an edge of the passivation layer 118. In some embodiments, the opening 118a exposes a portion of the waveguide 112, which is disposed opposite to and distal from the optical modulator 110. In some embodiments, the opening 118a is defined in the passivation layer 118 to allow transmitting and/or receiving of optical signals by the laser die. A method of forming the opening 118a includes an etch process.

Figure 1D:
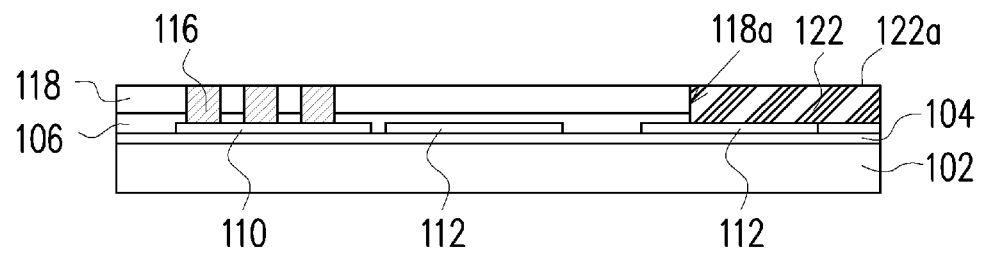
Figure 2D:
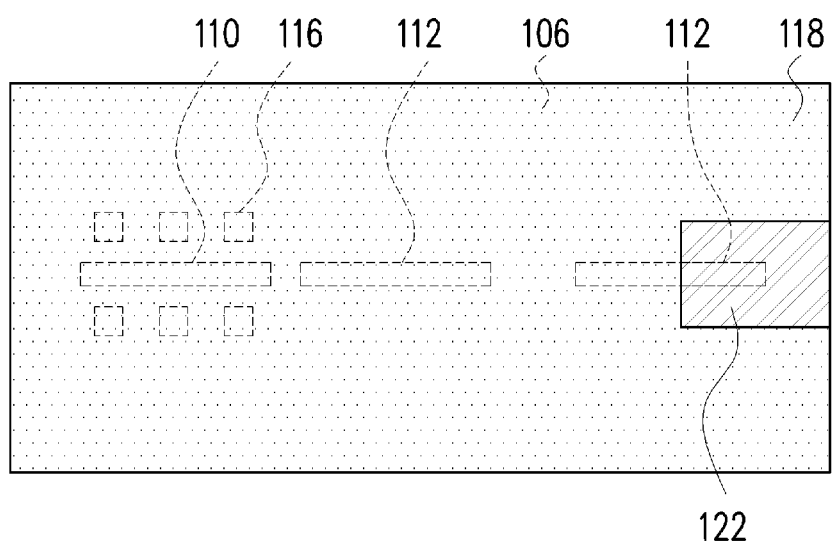

Referring to FIGS. 1D and 2D, then, an optical dielectric waveguide 122 is formed in the opening 118a, so as to form PIC 130. In some embodiments, a material of the optical dielectric waveguide 122 includes glass such as spin-on glass (SOG), silicon, silicon oxide, photoresist, epoxy, optical polymer such as polymethylmethacrylate, polyurethane or polyimide and other suitable optical dielectric material. In some embodiments, a top surface 122a of the optical dielectric waveguide 122 is coplanar with a top surface 118b of the passivation layer 118.

In some embodiments, the PIC 130 is configured to process, receive, and/or transmit optical signals. The PIC 130 is thus also being referred to as an optical chip in some applications. Optical signals are electromagnetic signals exhibiting a characteristic capable of being modeled by photons and are different from electrical signals which are signals carried by electrical charges, such as electrons, holes, or ions. In alternative embodiments, the PIC 130 further includes one or more active and/or passive components configured to process, receive and/or transmit electrical signals converted to/from optical signals by the laser die. In alternative embodiments, the PIC 130 further includes light detecting devices such as photo-sensors.

Figure 3A:
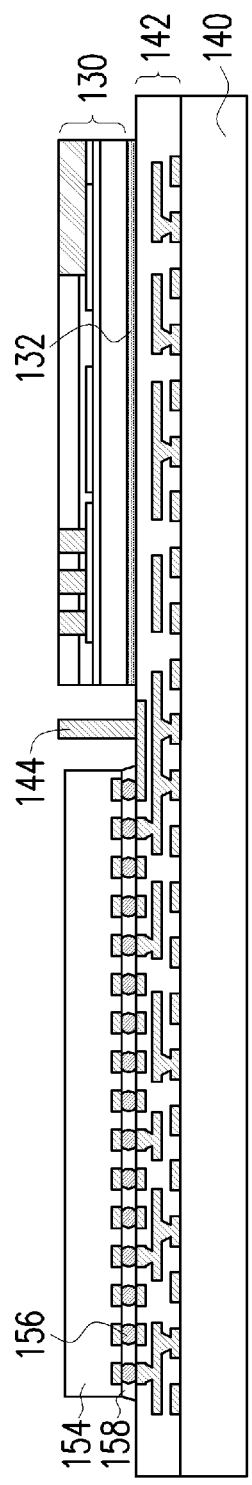
FIG. 3A to FIG. 3F are schematic cross sectional views of various stages in a manufacturing method of a semiconductor package according to some exemplary embodiments.

FIG. 3A to FIG. 3F are schematic cross sectional views of various stages in a manufacturing method of a semiconductor package according to some exemplary embodiments. Referring to FIG. 3A, a carrier 140 with a redistribution structure 142 formed thereon is provided. The carrier 140 may be a glass carrier or any suitable carrier for carrying a semiconductor wafer or a reconstituted wafer for the manufacturing method of the semiconductor package. In some embodiments, the redistribution structure 142 is a front-side redistribution structure. The formation of the redistribution structure 142 includes sequentially forming one or more dielectric layers and one or more metallization layers in alternation. In certain embodiments, the metallization layer(s) may be sandwiched between the dielectric layer(s). In some embodiments, the material of the metallization layer(s) includes aluminum, titanium, copper, nickel, tungsten, silver and/or alloys thereof. In some embodiments, the material of the dielectric layer(s) includes polyimide, benzocyclobutene, or polybenzoxazole.

Then, a through interlayer via ("TIV") 144 is formed on the redistribution structure 142 over the carrier 140. In some embodiments, the formation of the TIV 144 includes forming a mask pattern (not shown) with an opening on the redistribution structure 142 to partially expose the redistribution structure 142, then forming a metallic material (not shown) filling up the opening by electroplating or deposition, and removing the mask pattern to form the TIV 144 on the redistribution structure 142. The metallic material of the TIV 144 may be copper or a copper alloy. However, it is appreciated that the scope of this disclosure is not limited to the materials and descriptions disclosed above.

After that, a high performance integrated circuit 154 is attached to the redistribution structure 142, and the PIC 130 is placed on the redistribution structure 142. In some embodiments, the PIC 130 and the high performance integrated circuit 154 are disposed side by side, and the TIV 144 is disposed between the PIC 130 and the high performance integrated circuit 154. In some embodiments, the high performance integrated circuit 154 is CPU, GPU, FPGA or other suitable high performance integrated circuit. In some embodiments, the redistribution structure 142 is also a front-side redistribution structure of the high performance integrated circuit 154. In some embodiments, the high performance integrated circuit 154 is electrically connected to the redistribution structure 142 through a micro-bumping process, that is, a plurality of bumps 156 of the high performance integrated circuit 154 are bonded to the redistribution structure 142. In some embodiments, an adhesive layer 158 is further formed between the high performance integrated circuit 154 and the redistribution structure 142, for example. In some embodiments, the PIC 130 is placed on the carrier 140 by using a die attach film 132.

Figure 3B:
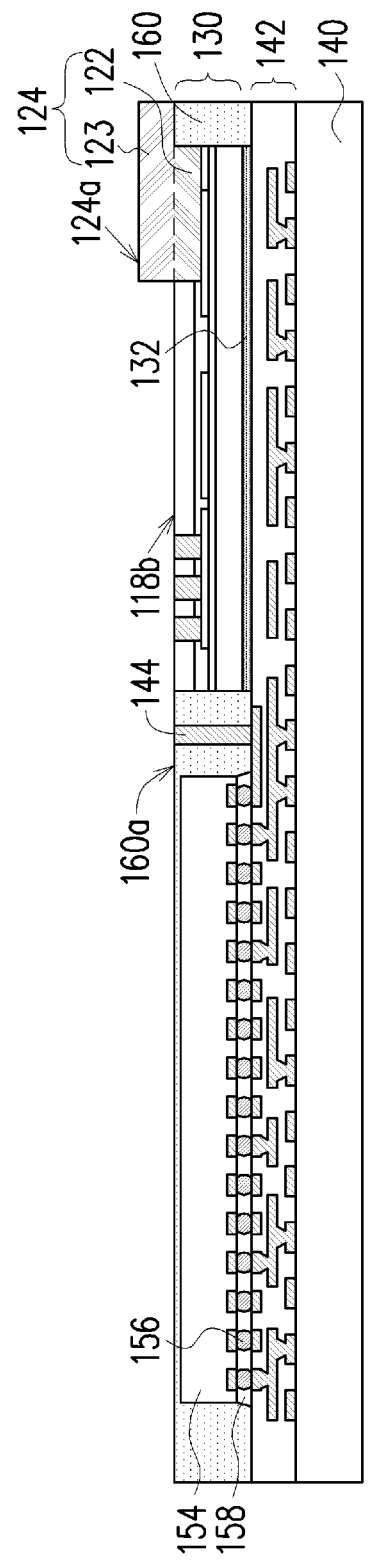

Referring to FIG. 3B, a molding compound 160 is formed over the carrier 140, and the high performance integrated circuit 154, the PIC 130 and the TIV 144 are encapsulated in the molding compound 160. A top surface 160a of the molding compound 160 is substantially coplanar with top surfaces of the PIC 130 and the TIV 144. In some embodiments, the molding compound 160 fills between or surrounds the high performance integrated circuit 154, the TIV 144, the PIC 130. In some embodiments, the molding compound 160 covers a top surface of the high performance integrated circuit 154. In alternative embodiments, the top surface of the high performance integrated circuit 154 may be exposed.

Then, an optical dielectric waveguide 123 is formed on the optical dielectric waveguide 122 and covers a portion of the molding compound 160, and the optical dielectric waveguide 123 and the optical dielectric waveguide 122 are collectively referred to as an optical dielectric waveguide 124. In some embodiments, a material of the optical dielectric waveguide 123 is, for example, the same as that of the optical dielectric waveguide 122. In alternative embodiments, a material of the optical dielectric waveguide 123 is different from that of the optical dielectric waveguide 122. After forming the optical dielectric waveguide 123, the optical dielectric waveguide 124 is disposed at the edge of the molding compound 160 and covers a portion of the molding compound 160. The optical dielectric waveguide 124 is close to the adjacent PICs. In some embodiments, a top surface 124a of the optical dielectric waveguide 124 relative to the carrier 140 is higher than the top surface 118b of the passivation layer 118 and the top surface 160a of the molding compound 160. In alternative embodiments, the top surface 124a of the optical dielectric waveguide 124 is substantially coplanar with the top surface 118b of the passivation layer 118 and the top surface 160a of the molding compound 160.

Figure 3C:
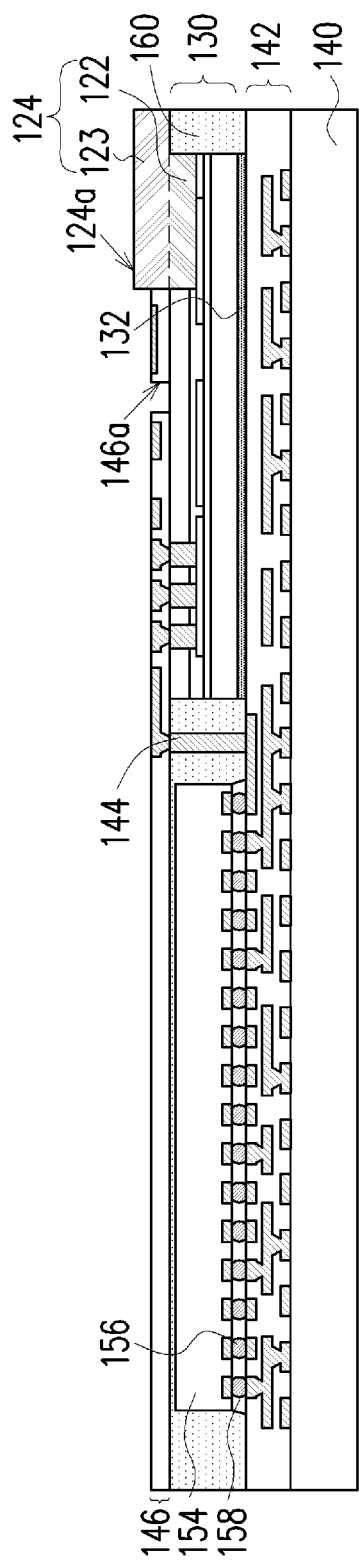

Referring to FIG. 3C, a redistribution structure 146 is formed over the molding compound 160 to electrically connect to the TIV 144 and the vias 116 of the PIC 130, wherein the redistribution structure 146 has a window opening 146a above the PIC 130.

Figure 3D:
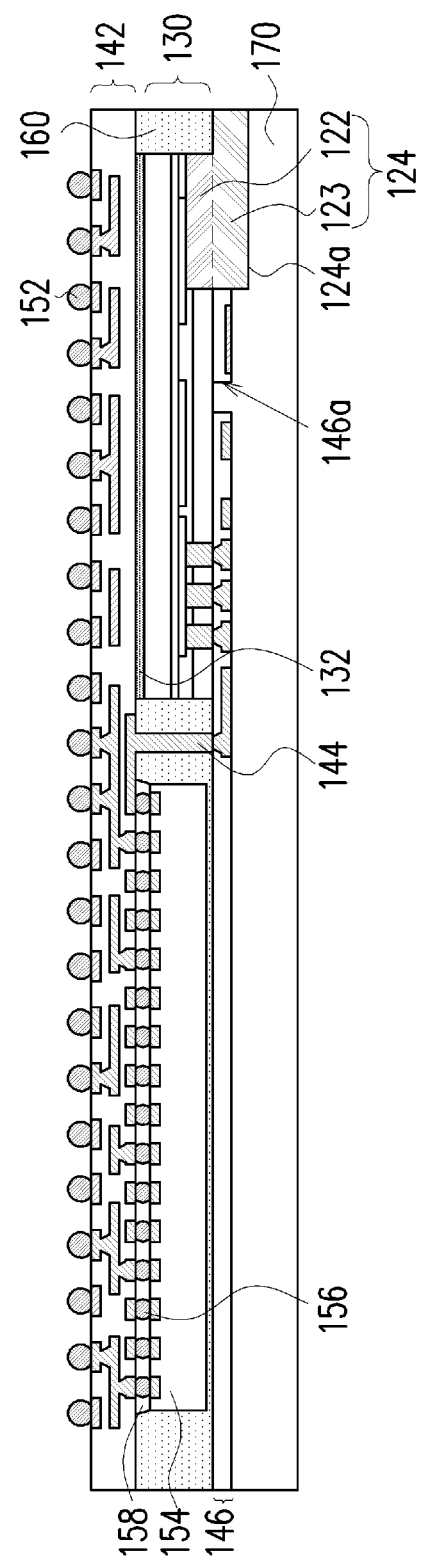

Referring to FIG. 3D, the structure in FIG. 3C is debonded from the carrier 140, and is turned upside down and disposed on a carrier 170. Then, a plurality of bumps 152 is formed over the redistribution structure 142.

Figure 3E:
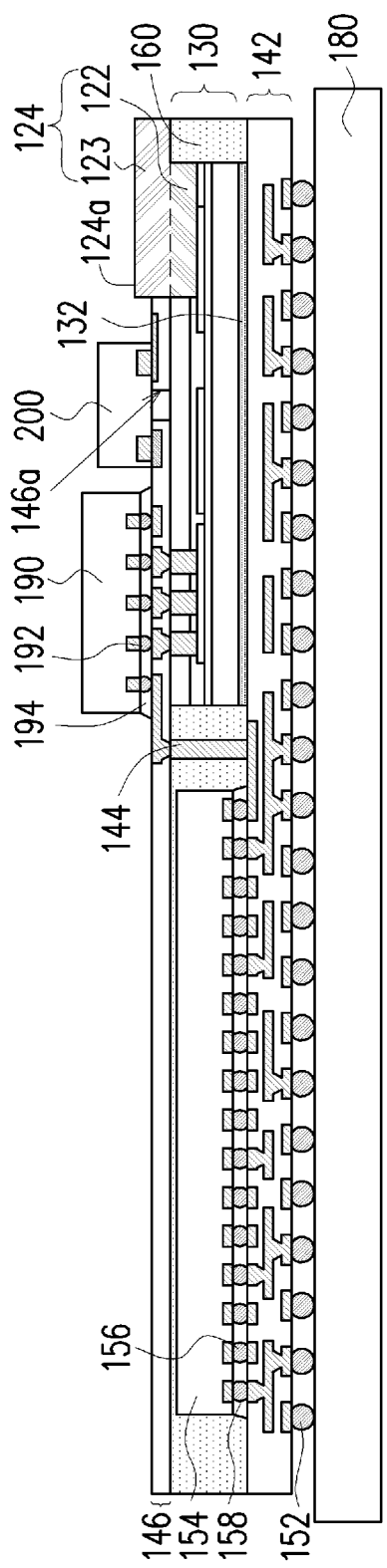

Referring to FIG. 3E, the structure in FIG. 3D is debonded from the carrier 170, and is turned upside down and disposed on a carrier 180. Then, an electronic integrated circuit ("EIC") 190 and laser die 200 are attached to the redistribution structure 146. In some embodiments, the EIC 190 is bonded to and electrically connected to the PIC 130 through the redistribution structure 146, and the laser die 200 is disposed on the window opening 146a over the PIC 130 to be optically coupled to the PIC 130. In some embodiments, a plurality of bumps 192 of the EIC 190 are bonded to the redistribution structure 146, and an adhesive layer 194 is formed therebetween, for example. In some embodiments, the EIC 190 is electrically connected to the high performance integrated circuit 154 through the redistribution structure 146, the TIV 144 and the redistribution structure 142. In some embodiments, the window opening 146a is disposed between and optically coupling the laser die 200 and the PIC 130. In some embodiments, the redistribution structure 146 is also a front-side redistribution structure of the PIC 130. In some embodiments, the EIC 190 is a driver IC, and includes one or more active components and/or passive components. Examples of passive components include, but are not limited to, resistors, capacitors, and inductors. Examples of active components include, but are not limited to, diodes, field effect transistors (FETs), metal-oxide-semiconductor FETs (MOSFETs), complementary metal-oxide-semiconductor (CMOS) transistors, and bipolar transistors.

In some embodiments, the laser die 200 is bonded to the redistribution structure 146 to electrically connect to the EIC 190 and optically connect with the PIC 130. Electrically connected shall mean that electrical current is capable passing from the EIC 190 to the laser die 200. Likewise, optically connected shall mean that light is capable passing from the laser die 200 to the PIC 130. The PIC 130 receives light from the laser die 200 with the waveguides 112. The PIC 130 encodes data by modulating the light into optical pulses through the optical modulator 110. The optical pulses pass through the optical dielectric waveguide 124 and may be transmitted to and communicated with adjacent PICs (not shown) through the optical dielectric waveguide 124 since the optical dielectric waveguide 124 is exposed.

Figure 3F:
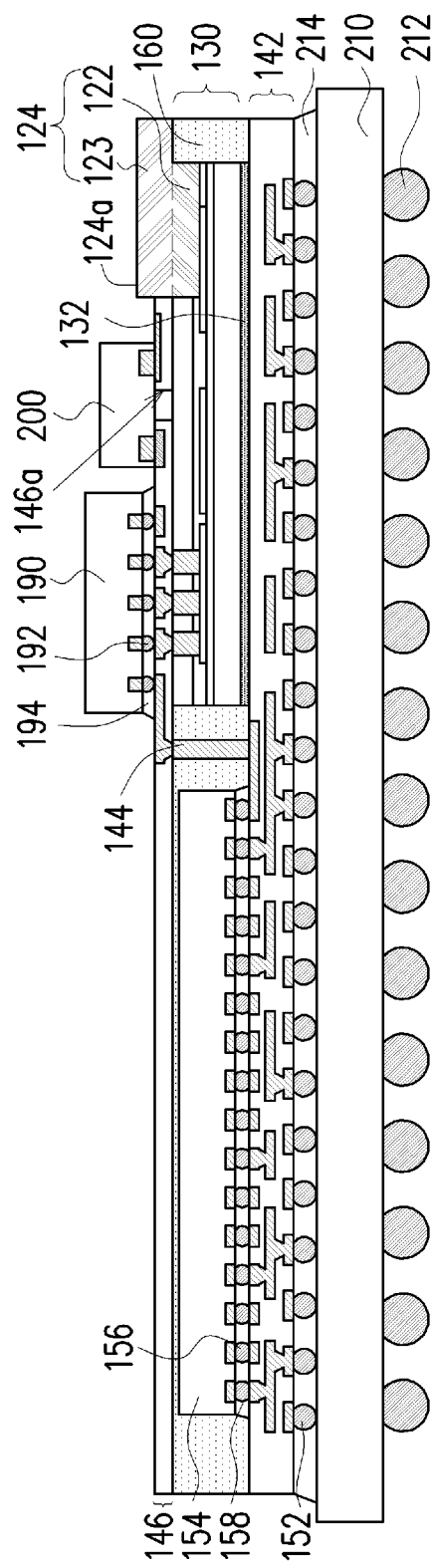

Referring to FIG. 3F, the structure in FIG. 3E is debonded from the carrier 180, and is bonded to a package substrate 210 through the bumps 152. In some embodiments, an adhesive layer 214 is formed between the structure and the package substrate 210. In some embodiments, the package substrate 210 includes connectors 212. In some embodiments, the connectors 212 are, for example, solder balls or ball grid array ("BGA") balls. In some embodiments, through the package substrate 210 and the bumps 152, some of the connectors 212 are electrically connected to the PIC 130, and some of the connectors 212 are electrically connected to the high performance integrated circuit 154. In certain embodiments, a dicing process is performed to cut the whole package structure along cutting lines into individual and separated semiconductor packages before attaching to the package substrate 210.

FIG. 4A to FIG. 4F are schematic cross sectional views of various stages in a manufacturing method of a semiconductor package according to some exemplary embodiments of the present disclosure. The difference between the method of FIG. 3A to FIG. 3F and the method of FIG. 4A to FIG. 4F lies in the arrangement of the PIC and the high performance integrated circuit. The difference is illustrated in details below, and the similarity is not iterated herein.

Figure 4A:
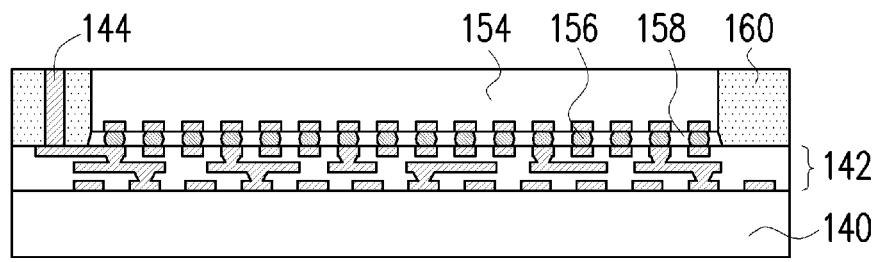
FIG. 4A to FIG. 4F are schematic cross sectional views of various stages in a manufacturing method of a semiconductor package according to some exemplary embodiments of the present disclosure.

Referring to FIG. 4A, a carrier 140 with a redistribution structure 142 formed thereon is provided. Then, TIV 144 and high performance integrated circuit 154 are formed over the carrier 140 and electrically connected to the redistribution structure 142. After that, a molding compound 160 is formed over the carrier 140, and the TIV 144 and the high performance integrated circuit 154 are encapsulated in the molding compound 160.

Figure 4B:
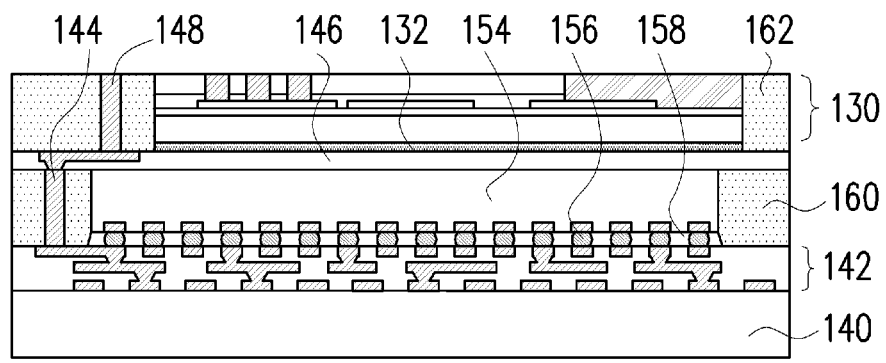

Referring to FIG. 4B, a redistribution structure 146 is formed over the molding compound 160 to electrically connect to the TIV 144. Then, TIV 148 and PIC 130 are formed over the redistribution structure 146. In some embodiments, the TIV 148 is electrically connected to the redistribution structure 146, and the PIC 130 is placed on the redistribution structure 146 by using a die attach film 132. After that, a molding compound 162 is formed over the redistribution structure 146, and the TIV 148 and the PIC 130 are encapsulated in the molding compound 162.

Figure 4C:
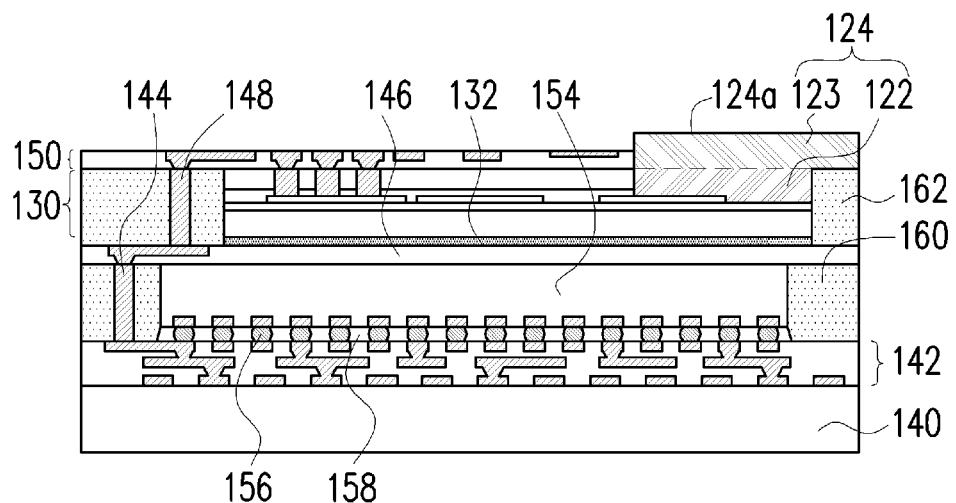

Referring to FIG. 4C, an optical dielectric waveguide 123 is formed on the optical dielectric waveguide 122 and covers a portion of the molding compound 162. Then, a redistribution structure 150 is formed over the molding compound 162 to electrically connect to the TIV 148 and the vias 116 of the PIC 130.

Figure 4D:
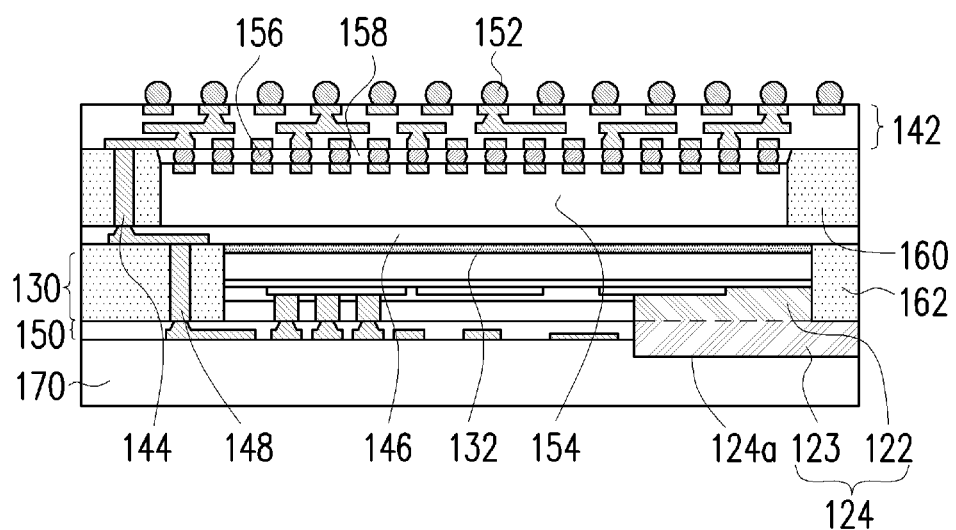

Referring to FIG. 4D, the structure in FIG. 4C is debonded from the carrier 140, and is turned upside down and disposed on a carrier 170. Then, a plurality of bumps 152 is formed over the redistribution structure 142.

Figure 4E:
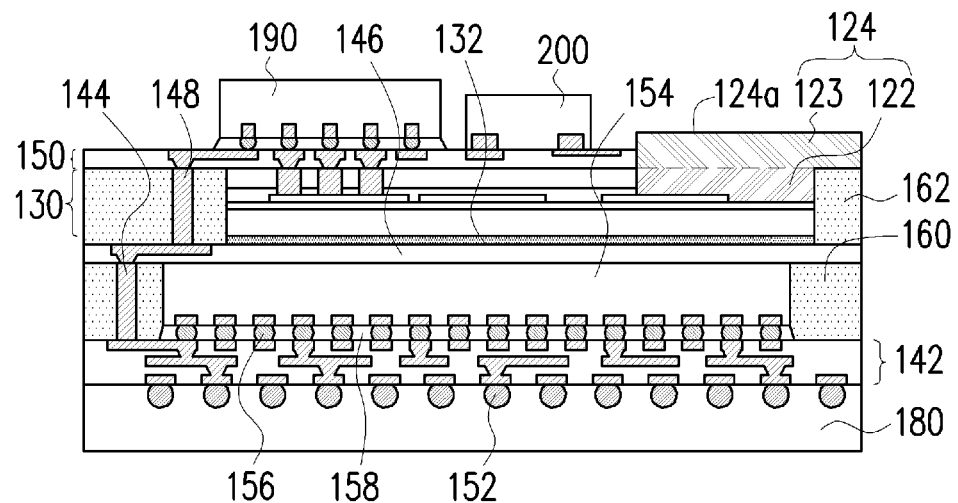

Referring to FIG. 4E, the structure in FIG. 4D is debonded from the carrier 170, and is turned upside down and disposed on a carrier 180. Then, an EIC 190 is bonded to the PIC 130 through the redistribution structure 150, and a laser die 200 is disposed above the PIC 130. In some embodiments, the EIC 190 is electrically connected to the high performance integrated circuit 154 through the redistribution structures 142, 146, 150 and the TIVs 144, 148. In some embodiments, the passivation layer 118 is made of a material transparent to optical signals transmitted and/or received by the laser die 200, and a portion of the window opening 146a (shown in FIG. 3C) corresponding to the passivation layer 118 is thus omitted.

Figure 4F:
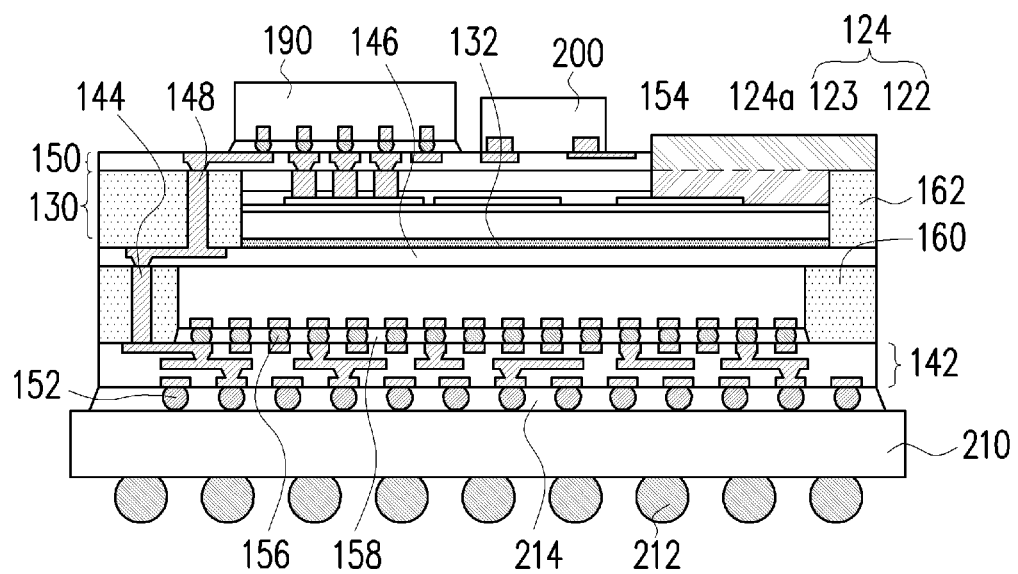

Referring to FIG. 4F, the structure in FIG. 4E is debonded from the carrier 180, and is bonded to a package substrate 210 through the bumps 152 and an adhesive layer 214. Subsequently, in certain embodiments, a dicing process is performed to cut the whole package structure along the cutting line into individual and separated semiconductor packages. In one embodiment, the dicing process is a wafer dicing process including mechanical blade sawing or laser cutting.

In above embodiments, the PIC, the EIC and the high performance integrated circuit are integrated with an InFO platform. The PIC and the high performance integrated circuit may be disposed side by side (shown in FIG. 3F) or stacked on each other (shown in FIG. 4F), and the EIC and the laser die are stacked over the PIC. In some embodiments, the window opening of the redistribution structure is used for laser coupling and transmission. The optical dielectric waveguide is exposed and used for coupling light from the waveguide such as the silicon waveguide and communicating with adjacent PICs.

Figure 5A:
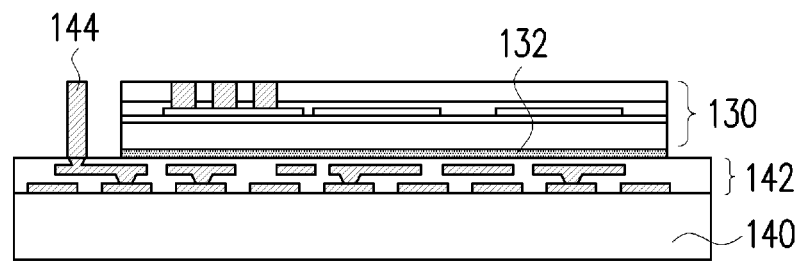
FIG. 5A to FIG. 5D are schematic cross sectional views of various stages in a manufacturing method of a semiconductor package according to some exemplary embodiments.

FIG. 5A to FIG. 5D are schematic cross sectional views of various stages in a manufacturing method of a semiconductor package according to some exemplary embodiments. Referring to FIG. 5A, a carrier 140 with a redistribution structure 142 formed thereon is provided. Then, a TIV 144 is formed on the redistribution structure 142 over the carrier 140. After that, a PIC 130 is placed on the redistribution structure 142. In some embodiments, the PIC 130 is placed on the carrier 140 by using a die attach film 132. In some embodiments, the PIC 130 has a structure depicted in FIG. 1B, in other words, the PIC 130 does not include an optical dielectric waveguide 122.

Figure 5B:
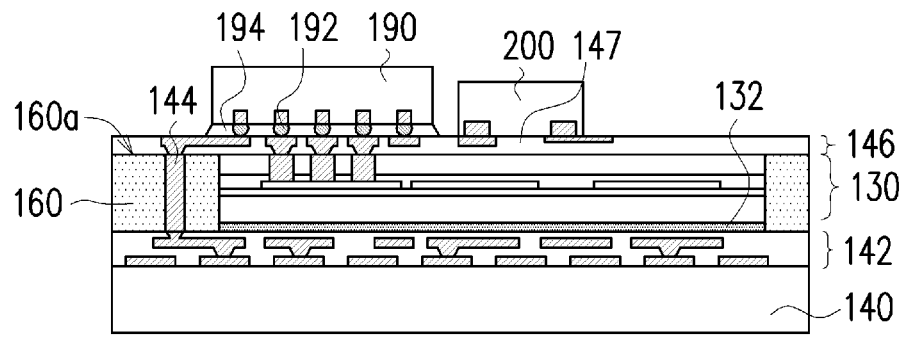

Referring to FIG. 5B, a molding compound 160 is formed over the carrier 140, and the PIC 130 and the TIV 144 are encapsulated in the molding compound 160. A top surface 160a of the molding compound 160 is substantially coplanar with top surfaces of the PIC 130 and the TIV 144. In some embodiments, the molding compound 160 fills between the PIC 130 and the TIV 144.

Then, a redistribution structure 146 is formed over the molding compound 160 to electrically connect to the TIV 144 and the vias 116 of the PIC 130. In some embodiments, the redistribution structure 146 is also a front-side redistribution structure of the PIC 130. In some embodiments, the redistribution structure 146 includes an optical dielectric layer 147 between the laser die 200 and the waveguide 112 of the PIC 130 for laser coupling and transmission. In some embodiments, a material of the optical dielectric layer 147 includes glass, silicon, silicon oxide, optical polymer and other suitable optical dielectric material.

After that, EIC 190 and laser die 200 are attached to the redistribution structure 146. In some embodiments, the EIC 190 is bonded to the PIC 130 through the redistribution structure 146, and the laser die 200 is bonded to the redistribution structure 146 over the PIC 130. In some embodiments, a plurality of bumps 192 of the EIC 190 is bonded to the redistribution structure 146, and an adhesive layer 194 is formed therebetween, for example. In some embodiments, the EIC 190 and the laser die 200 are disposed on the same side of the PIC 130.

Figure 5C:
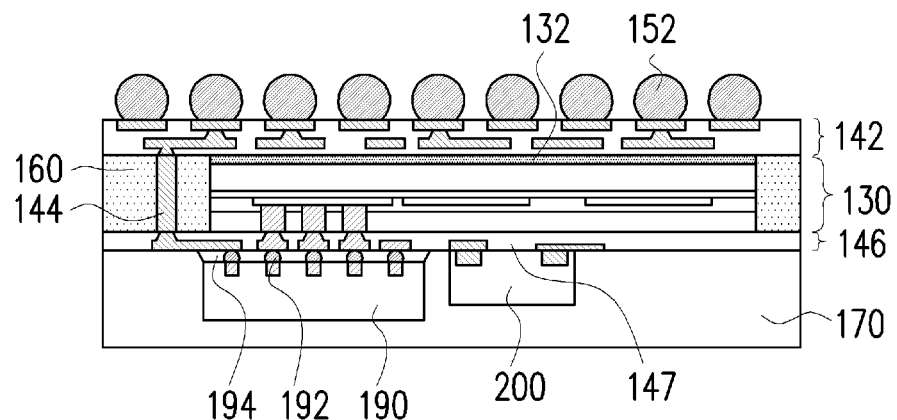

Referring to FIG. 5C, the structure in FIG. 5B is debonded from the carrier 140, and is turned upside down and disposed on a carrier 170. Then, a plurality of bumps 152 is formed over the redistribution structure 142.

Figure 5D:
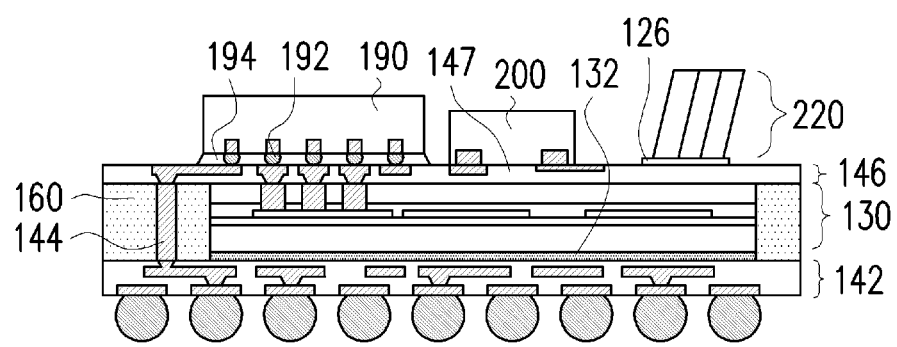

Referring to FIG. 5D, the structure in FIG. 5C is debonded from the carrier 170, and is turned upside down. Then, a light coupler 220 is disposed over the PIC 130. In some embodiments, the light coupler 220 is attached to the PIC 130 by using an adhesive layer 126. In some embodiments, the redistribution structure 146 includes an optical dielectric layer 147 between the light coupler 220 and the waveguide 112 of the PIC 130 for optically coupling and transmission. In certain embodiments, a dicing process is performed to cut the whole package structure along the cutting line into individual and separated semiconductor packages before attaching the light coupler 220. In one embodiment, the dicing process is a wafer dicing process including mechanical blade sawing or laser cutting.

In some embodiments, the PIC and the EIC are integrated with an InFO platform. In some embodiments, the optical dielectric layer of the redistribution structure over the PIC is used for laser coupling and transmission. In addition, the optical dielectric layer is also used for coupling light from the waveguide such as the silicon waveguide to the light coupler such as fiber. Furthermore, the control signal to the EIC is directly from the bumps to the redistribution structures and the TIV.

FIG. 6A to FIG. 6F are schematic cross sectional views of various stages in a manufacturing method of a semiconductor package according to some exemplary embodiments of the present disclosure. The difference between the method of FIG. 3A to FIG. 3F and the method of FIG. 6A to FIG. 6F lies in the arrangement of the PIC is disposed in a face down manner. The difference is illustrated in details below, and the similarity is not iterated herein.

Figure 6A:
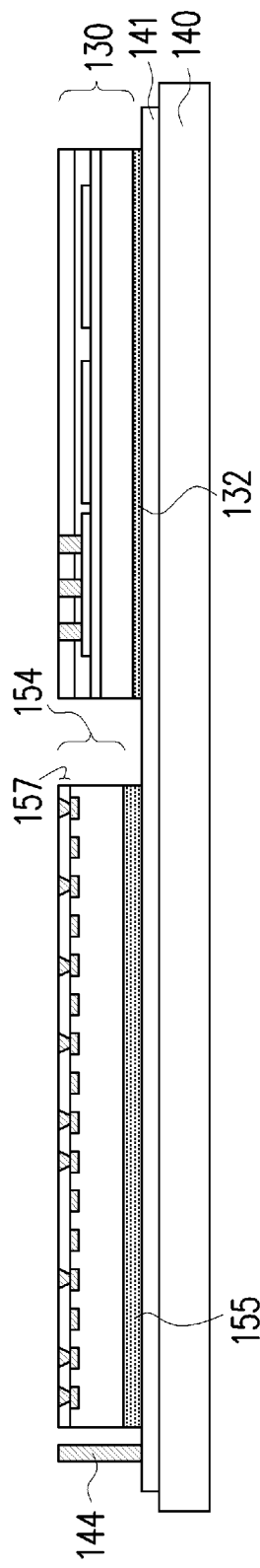
FIG. 6A to FIG. 6F are schematic cross sectional views of various stages in a manufacturing method of a semiconductor package according to some exemplary embodiments of the present disclosure.

Referring to FIG. 6A, a carrier 140 with a buffer layer 141 coated thereon is provided. In some embodiments, the buffer layer 141 includes a debond layer and the material of the debond layer may be any material suitable for bonding and debonding the carrier 140 from the above layers or wafer disposed thereon. In some embodiments, the buffer layer 141 includes, for example, a light-to-heat conversion ("LTHC") layer, and such layer enables room temperature debonding from the carrier by applying laser irradiation. The buffer layer 141 may include a dielectric layer made of a dielectric material including benzocyclobutene ("BCB"), polybenzoxazole ("PBO"), or any other suitable polymer-based dielectric material.

Then, TIV 144, high performance integrated circuit 154 and PIC 130 are formed over the buffer layer 141. In some embodiments, the high performance integrated circuit 154 and the PIC 130 are placed on the carrier 140 by using die attach films 132, 155 respectively. In some embodiments, the PIC 130 has a structure depicted in FIG. 1B, in other words, the PIC 130 does not include an optical dielectric waveguide 122. In some embodiments, the high performance integrated circuit 154 and the PIC 130 are disposed side by side. In some embodiments, the high performance integrated circuit 154 includes a redistribution structure 157 therein.

Figure 6B:
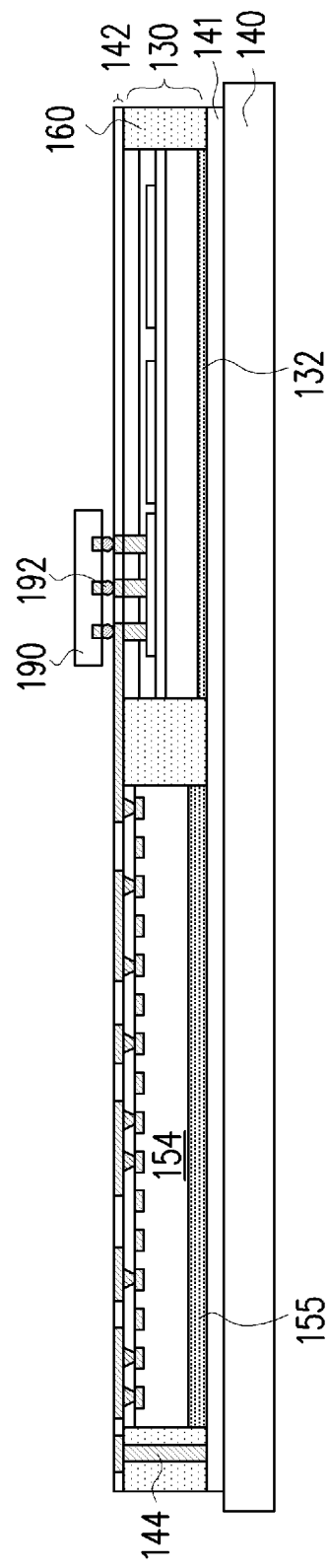

Referring to FIG. 6B, a molding compound 160 is formed over the carrier 140, and the TIV 144, the high performance integrated circuit 154 and the PIC 130 are encapsulated in the molding compound 160. Then, a redistribution structure 142 is formed over the molding compound 160 to electrically connect the TIV 144, the redistribution structure 157 of the high performance integrated circuit 154 and the vias 116 of the PIC 130. Then, an EIC 190 is disposed on and bonded to the PIC 130. In some embodiments, the EIC 190 and the PIC 130 are electrically connected through the redistribution structure 142, and the EIC 190 and the high performance integrated circuit 154 are also electrically connected through the redistribution structure 142.

Figure 6C:
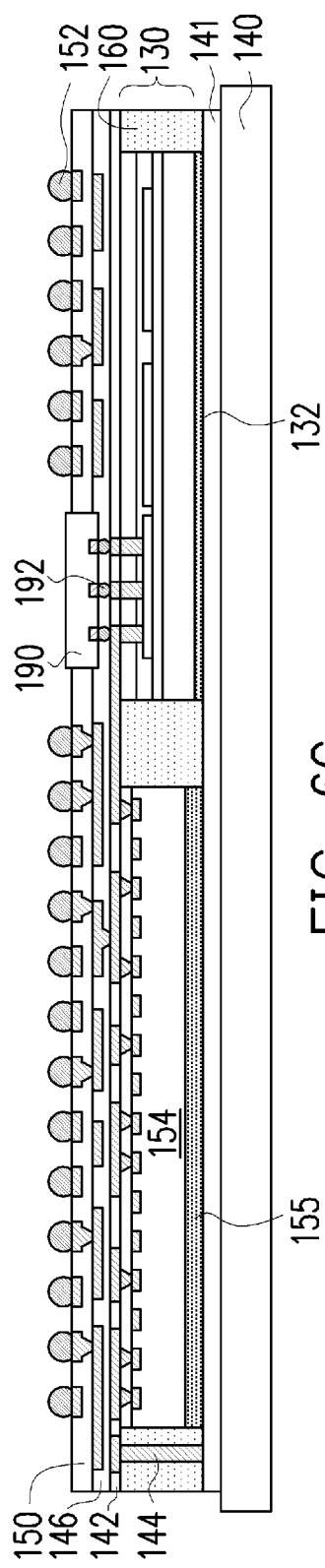

Referring to FIG. 6C, redistribution structures 146, 150 are formed over and electrically connected to the redistribution structure 142, wherein the EIC 190 is embedded in the redistribution structures 146, 150. Then, a plurality of bumps 152 is formed over the redistribution structure 150.

Figure 6D:
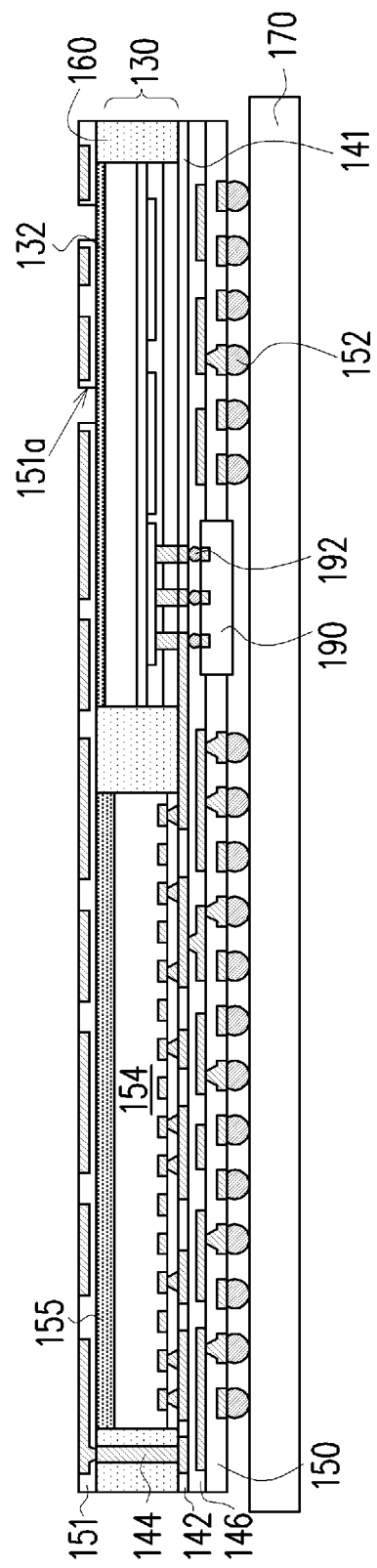

Referring to FIG. 6D, the structure in FIG. 6C is debonded from the carrier 140, and is turned upside down and disposed on a carrier 170. Then, a redistribution structure 151 is formed over back surfaces of the high performance integrated circuit 154 and the PIC 130. After that, the window openings 151a are formed in the redistribution structure 151, for example.

Figure 6E:
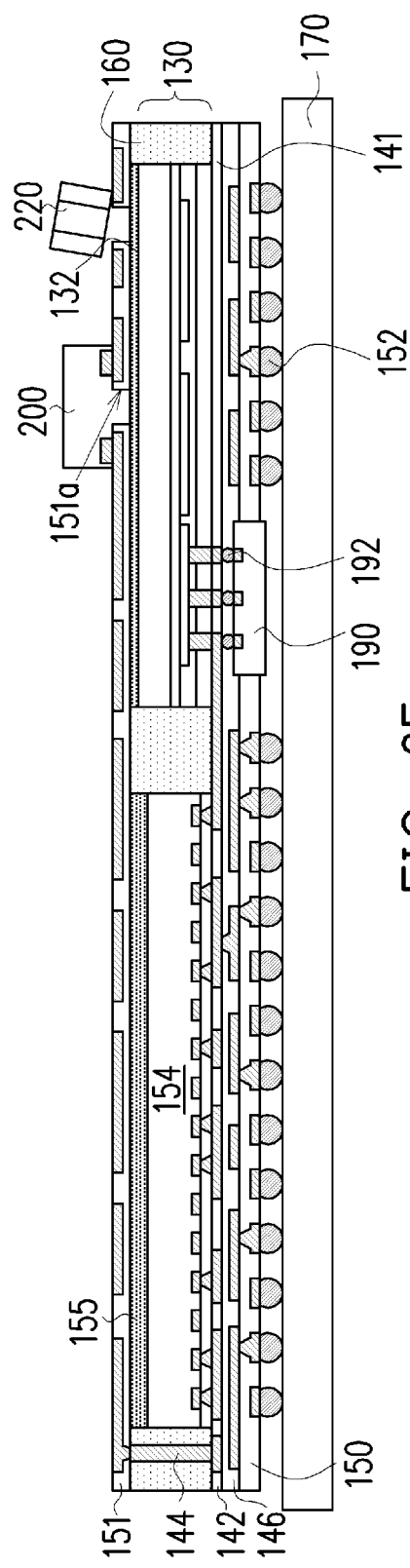

Referring to FIG. 6E, laser die 200 and light coupler 220 are disposed on the window openings 151a above the PIC 130 respectively. In some embodiments, the light coupler 220 may be an optical fiber. In some embodiments, the window opening 151a is disposed between the light coupler 220 and the PIC 130 and optically coupling the light coupler 220 and the PIC 130. In some embodiments, the window opening 151a is disposed between the laser die 200 and the PIC 130 and optically coupling the laser die 200 and the PIC 130. In some embodiments, the substrate 102 of the PIC 130 such as a bulk silicon is between the waveguide 112 and the laser die 200 and thus used for laser coupling and transmission.

Figure 6F:
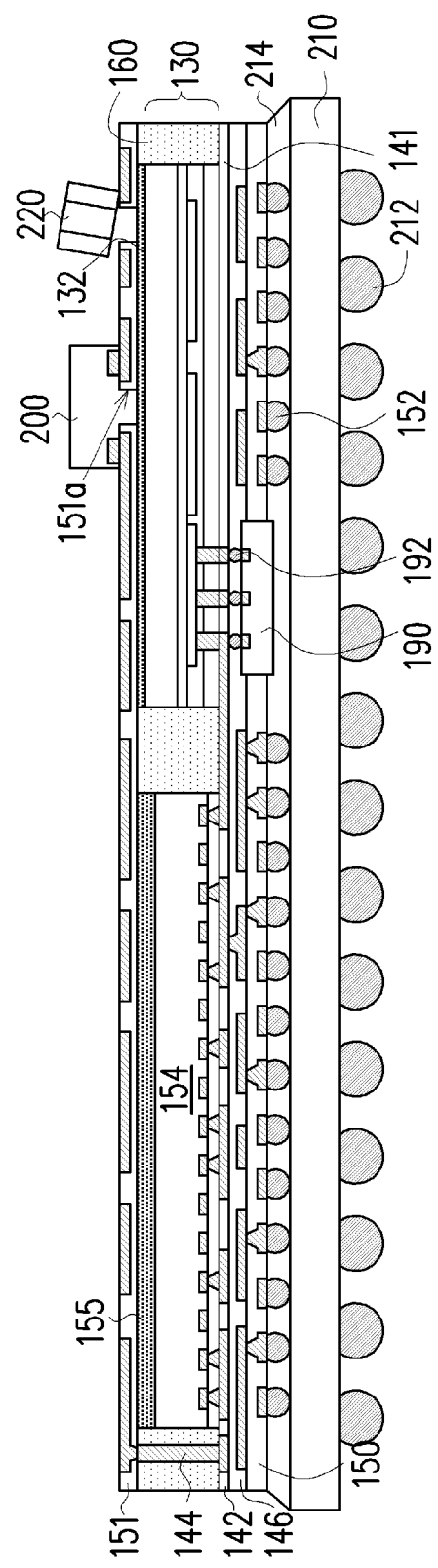

Referring to FIG. 6F, the structure in FIG. 6E is debonded from the carrier 170, and is bonded to a package substrate 210 through the bumps 152 and an adhesive layer 214.

In some embodiments, the PIC, the EIC and the high performance integrated circuit are integrated with an InFO platform. In some embodiments, the window openings of the redistribution structure are used for laser coupling and transmission. Since the PIC is disposed face down, the substrate of the PIC such as a bulk silicon is used for laser coupling and transmission, and the light coupler is used for communication with adjacent PICs. By forming the redistribution structures, the interconnect between the high performance integrated circuit and the EIC and between the EIC and the PIC is shorten.

FIG. 7A to FIG. 7D are schematic cross sectional views of various stages in a manufacturing method of a semiconductor package according to some exemplary embodiments of the present disclosure. The difference between the method of FIG. 3A to FIG. 3F and the method of FIG. 7A to FIG. 7D lies in the arrangement of the EIC being disposed between the PIC and the high performance integrated circuit in a side by side arrangement. The difference is illustrated in details below, and the similarity is not iterated herein.

Figure 7A:
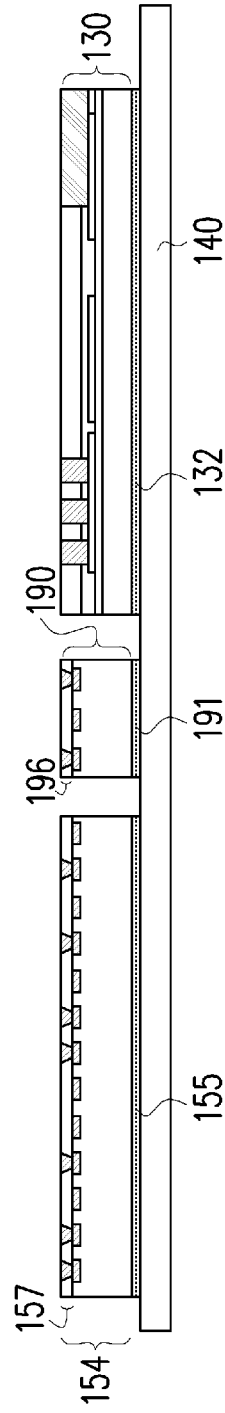
FIG. 7A to FIG. 7D are schematic cross sectional views of various stages in a manufacturing method of a semiconductor package according to some exemplary embodiments of the present disclosure.

Referring to FIG. 7A, high performance integrated circuit 154, EIC 190 and PIC 130 are formed over a carrier 140 through die attach films 155, 191, 132. In some embodiments, the high performance integrated circuit 154 includes a redistribution structure 157 therein. In some embodiments, the EIC 190 includes a redistribution structure 196 therein. In alternative embodiments, the EIC 190 may be part of the high performance integrated circuit 154.

Figure 7B:
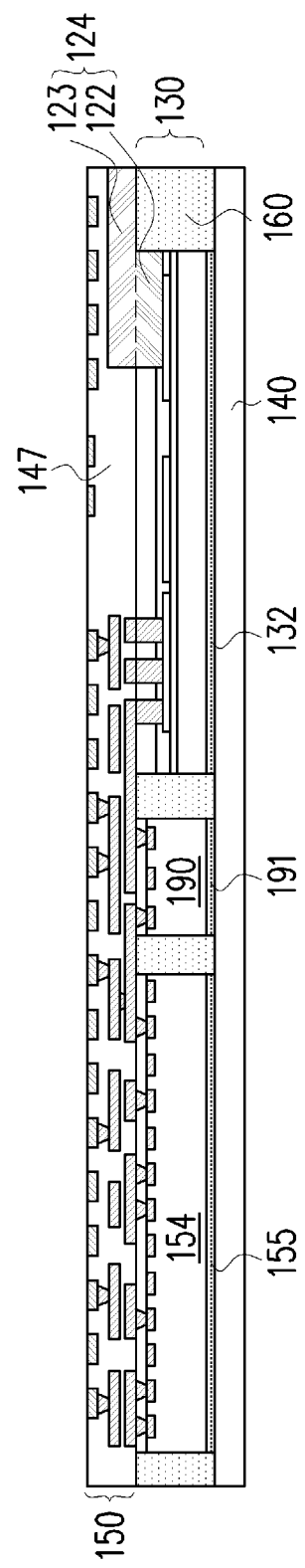

Referring to FIG. 7B, a molding compound 160 is formed over the carrier 140, and the high performance integrated circuit 154, the EIC 190 and the PIC 130 are encapsulated in the molding compound 160. Then, an optical dielectric waveguide 123 is formed on the optical dielectric waveguide 122 and a portion of the molding compound 160. After that, a redistribution structure 150 is formed over the molding compound 160 to electrically connect the high performance integrated circuit 154 and the EIC 190, and the optical dielectric waveguide 124 is embedded in the redistribution structure 150. In some embodiments, a side surface of the optical dielectric waveguide 124 is exposed. In some embodiments, the EIC 190 and the PIC 130 are electrically connected through the redistribution structure 150, and the EIC 190 and the high performance integrated circuit 154 are also electrically connected through the redistribution structure 150.

Figure 7C:
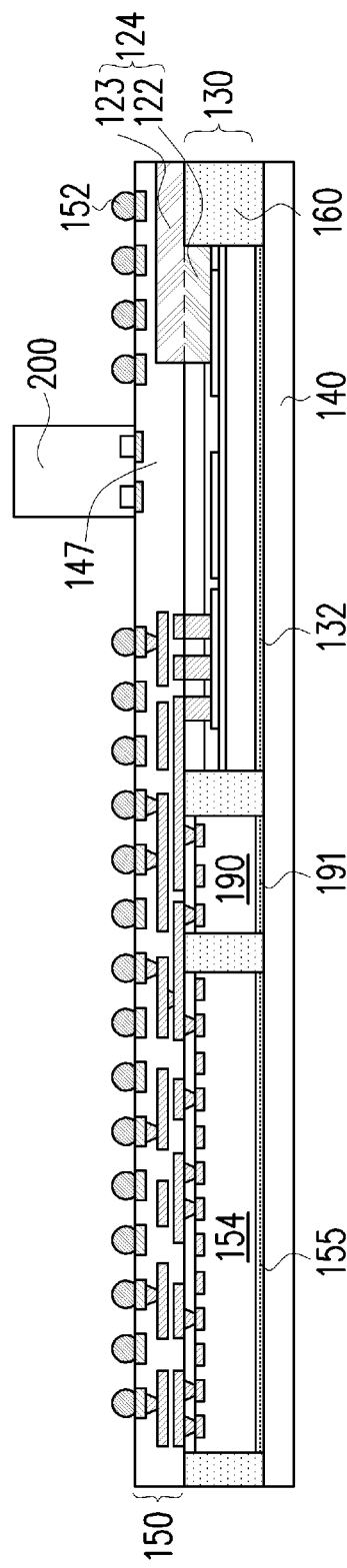

Referring to FIG. 7C, a plurality of bumps 152 is formed over the redistribution structure 150. Then, a laser die 200 is disposed on and bonded to the redistribution structure 150.

Figure 7D:
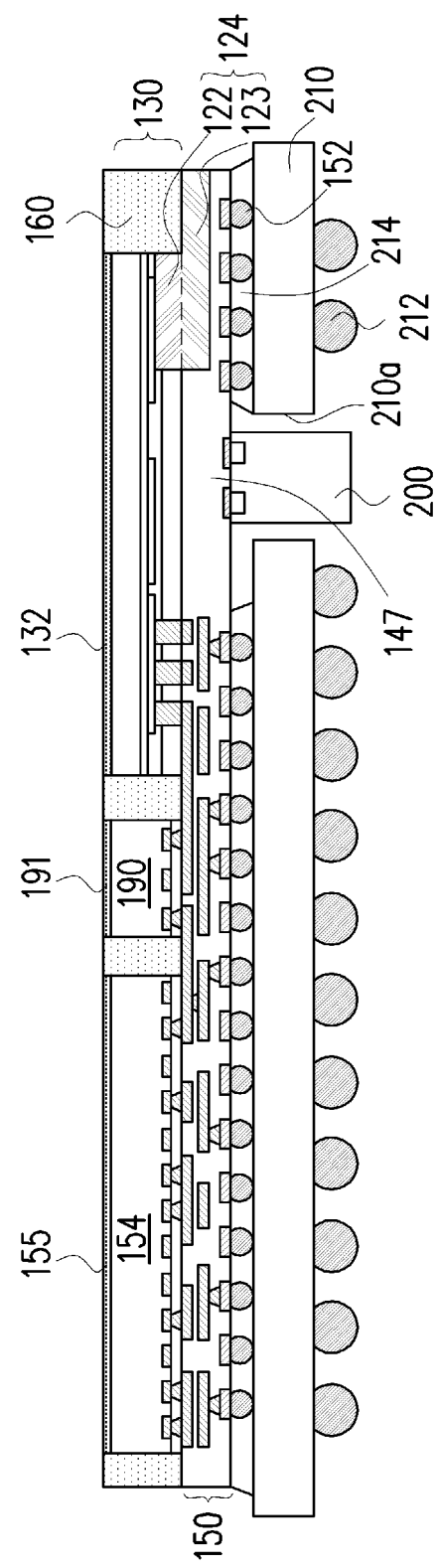

Referring to FIG. 7D, the structure in FIG. 7C is debonded from the carrier 140, and the structure is turned upside down and is bonded to a package substrate 210 through the bumps 152 and an adhesive layer 214. In some embodiments, the package substrate 210 is formed with an opening 210a therethrough, and the laser die 200 is disposed in the opening 210a. In some embodiments, the optical dielectric waveguide 124 is disposed between a portion of the molding compound 160 and the package substrate 210. In some embodiments, an optical dielectric layer 147 of the redistribution structure 150 is disposed between the PIC 130 and the laser die 200 for laser coupling and transmission.

FIG. 8A to FIG. 8F are schematic cross sectional views of various stages in a manufacturing method of a semiconductor package according to some exemplary embodiments of the present disclosure. The difference between the method of FIG. 3A to FIG. 3F and the method of FIG. 8A to FIG. 8F is illustrated in details below, and the similarity is not iterated herein.

Figure 8A:
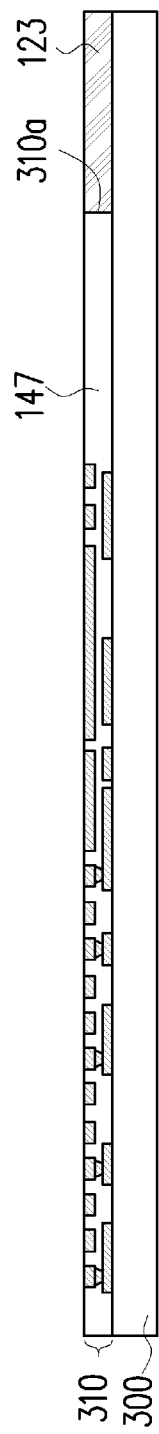
FIG. 8A to FIG. 8F are schematic cross sectional views of various stages in a manufacturing method of a semiconductor package according to some exemplary embodiments of the present disclosure.

Referring to FIG. 8A, a substrate 300 is provided, and a redistribution structure 310 having an opening 310a is formed on the substrate 300. In some embodiments, the substrate 300 is also being referred to as an interposer, and the substrate 300 is a silicon wafer, for example. In some embodiments, TIVs may be also formed over the substrate 300. Then, an optical dielectric waveguide 123 is formed in the opening 310a.

Figure 8B:
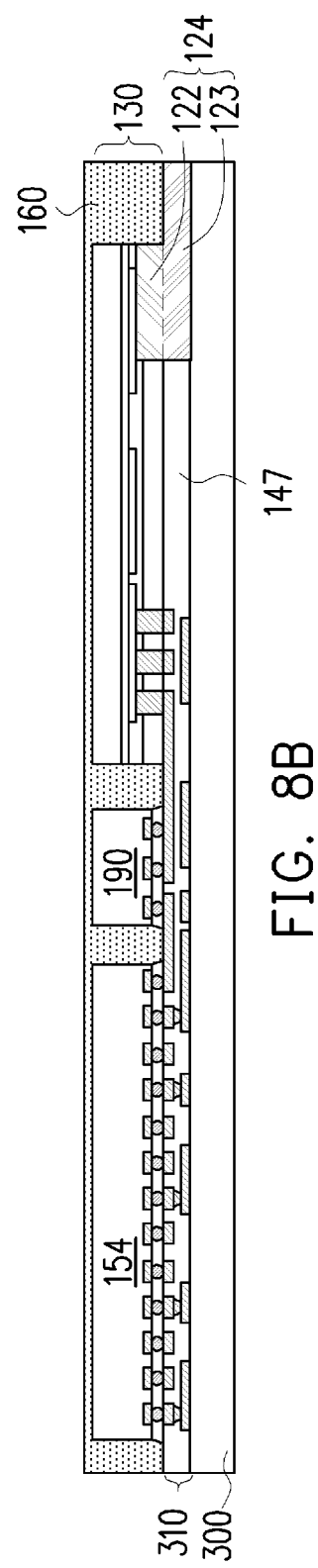

Referring to FIG. 8B, high performance integrated circuit 154, EIC 190 and PIC 130 are formed over the substrate 300 and bonded to the redistribution structure 310. Then, a molding compound 160 is formed over the substrate 300, and the high performance integrated circuit 154, the EIC 190 and the PIC 130 are encapsulated in the molding compound 160.

Figure 8C:
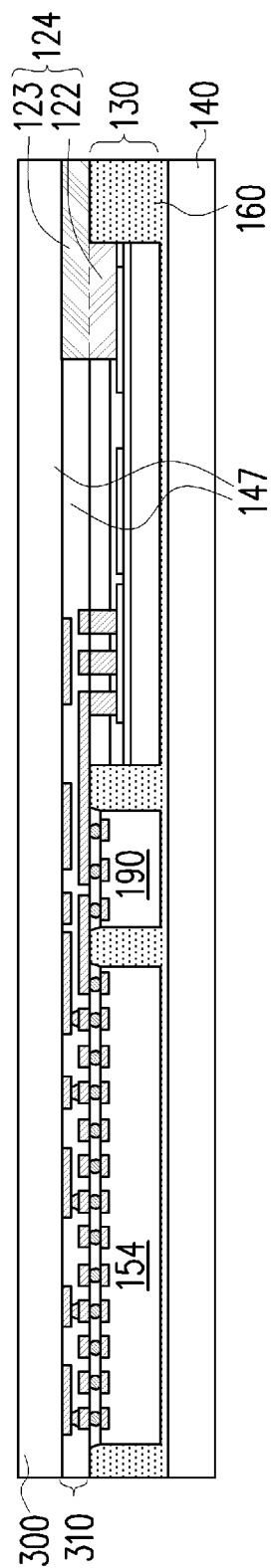

Referring to FIG. 8C, the structure in FIG. 8B is turned upside down and the high performance integrated circuit 154, the EIC 190 and the PIC 130 are attached to a carrier 140, for example, by using die attach films (not shown).

Figure 8D:
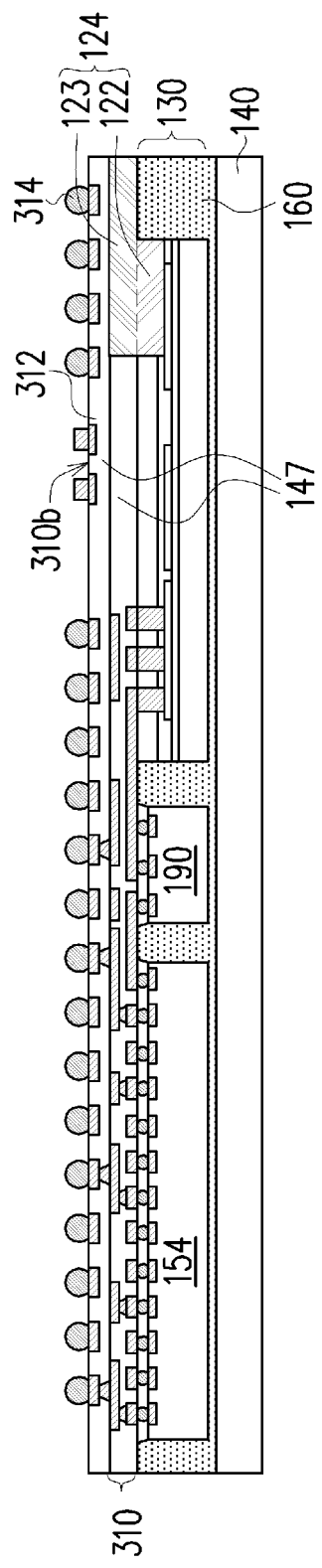

Referring to FIG. 8D, a thinning process is performed on the substrate 300, and the substrate 300 is removed. Then, a redistribution structure 312 is formed over the substrate 300. After that, a plurality of bumps 314 is formed over the redistribution structure 310, and a portion 310b of a surface of the redistribution structure 310 over the PIC 130 is retained without forming the bumps 314.

Figure 8E:
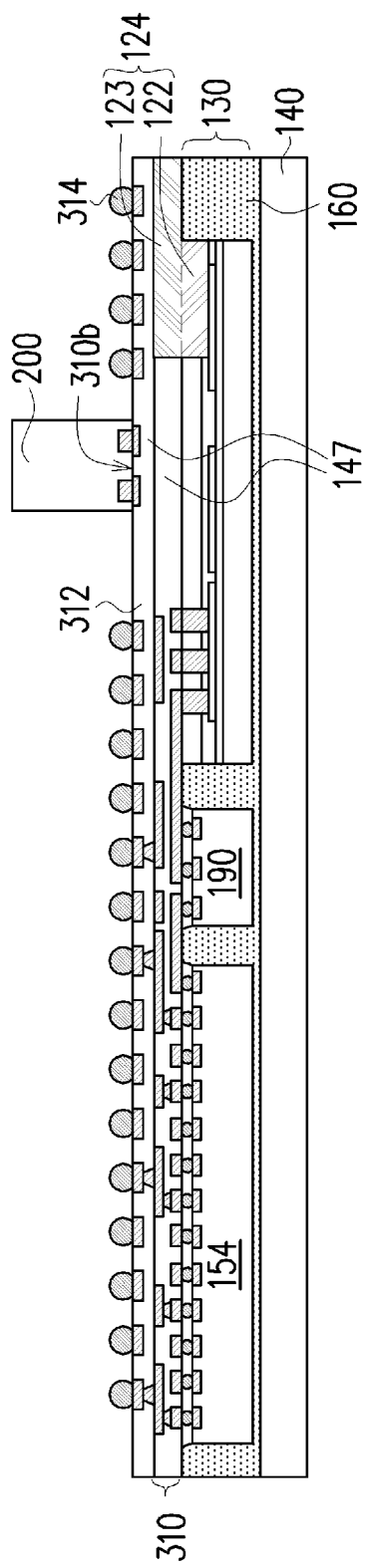

Referring to FIG. 8E, a laser die 200 is disposed on the portion 310b of the surface of the redistribution structure 310 and bonded to the redistribution structure 310.

Figure 8F:
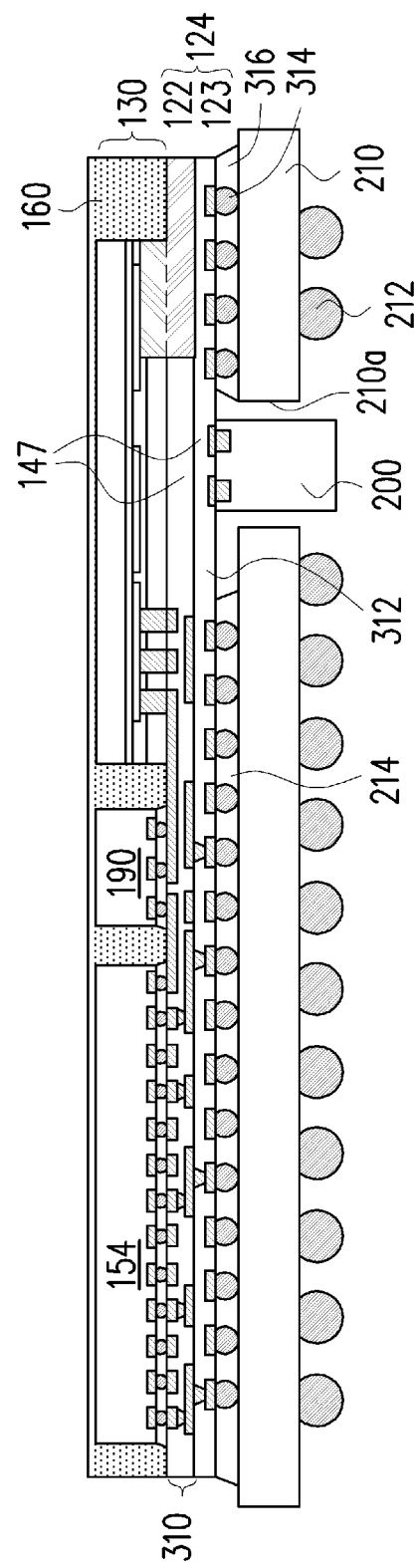

Referring to FIG. 8F, the structure in FIG. 8E is debonded from the carrier 140, and the structure is turned upside down and is bonded to a package substrate 210 through the bumps 314 and an adhesive layer 316. In some embodiments, the package substrate 210 is formed with an opening 210a therethrough, and the laser die 200 is disposed in the opening 210a. In some embodiments, the redistribution structures 310, 312 include an optical dielectric layer 147 disposed between the PIC 130 and the laser die 200 for laser coupling and transmission.

In some embodiments, the EIC 190 and the PIC 130 are disposed side by side, and the redistribution structure 310 is disposed between the PIC 130 and the package substrate 210 and between the EIC 190 and the package substrate 210. In some embodiments, the EIC 190 and the PIC 130 are electrically connected through the redistribution structure 310, and the EIC 190 and the high performance integrated circuit 154 are also electrically connected through the redistribution structure 310.

In some embodiments, the PIC, the EIC and the high performance integrated circuit are integrated with an InFO platform or other platform such as a CoWoS platform, and the PIC and the EIC are electrically connected through the redistribution structure. Therefore, a shortened conductive path between the PIC and the package substrate is allowed. In some embodiments, shortened conductive path means lowered parasitic capacitance and resistance along the conductive path, and thus in turn helps to decrease power loss and increase operation frequency and operation speed of the resulting device. In addition, the optical dielectric waveguide provides a compact form factor. High operation speed and high bandwidth communication are provided among the PIC, the EIC and the high performance integrated circuit, and thus the semiconductor package may be applied in multi-core high performance computing (HPC) applications.

According to some embodiments, a semiconductor package includes a package substrate, a photonic integrated circuit, a laser die, an electronic integrated circuit, and a first redistribution structure. The package substrate includes connectors. The photonic integrated circuit is disposed over the package substrate. The laser die is optically coupled to the photonic integrated circuit. The electronic integrated circuit is disposed over the package substrate. The first redistribution structure is disposed over the package substrate, wherein the electronic integrated circuit is electrically connected to the photonic integrated circuit through the first redistribution structure.

According to some embodiments, a semiconductor package includes a package substrate, a photonic integrated circuit, a laser die, an electronic integrated circuit, a high performance integrated circuit, and a redistribution structure. The photonic integrated circuit is disposed over the package substrate and includes an optical dielectric waveguide, wherein a portion of the optical dielectric waveguide is exposed. The laser die is optically coupled to the photonic integrated circuit. The electronic integrated circuit is disposed over the package substrate and electrically connected to the photonic integrated circuit. The high performance integrated circuit is disposed over the package substrate and electrically connected to the electronic integrated circuit. The redistribution structure is disposed over the package substrate.

According to some embodiments, a semiconductor package includes a package substrate, a photonic integrated circuit, a laser die, an electronic integrated circuit, and a redistribution structure. The package substrate includes connectors. The photonic integrated circuit is disposed over the package substrate. The laser die is optically coupled to the photonic integrated circuit. The electronic integrated circuit is disposed over the package substrate and electrically connected to the photonic integrated circuit. The redistribution structure is disposed over the package substrate and includes an optical dielectric layer disposed between and optically coupling the laser die and the photonic integrated circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor package, comprising:
    forming a photonic integrated circuit;
    forming an electronic integrated circuit and a first redistribution structure, wherein the electronic integrated circuit is electrically connected to the photonic integrated circuit through the first redistribution structure; and
    forming a high performance integrated circuit and a second redistribution structure, wherein the high performance integrated circuit is electrically connected to the electronic integrated circuit through the second redistribution structure.

2. The method as claimed in claim 1, wherein the first redistribution structure is formed between the electronic integrated circuit and the photonic integrated circuit.

3. The method as claimed in claim 1, wherein the first redistribution structure and the second redistribution structure are formed at opposite sides of the photonic integrated circuit.

4. The method as claimed in claim 1, wherein the photonic integrated circuit and the high performance integrated circuit are respectively formed between the first redistribution structure and the second redistribution structure.

5. The method as claimed in claim 1, wherein the high performance integrated circuit, the photonic integrated circuit and the electronic integrated circuit are formed to stack on one another, and the photonic integrated circuit is formed between the electronic integrated circuit and the high performance integrated circuit.

6. The method as claimed in claim 1, wherein the high performance integrated circuit, the electronic integrated circuit and the photonic and the electronic integrated circuit are respectively formed over the first redistribution structure and the second redistribution structure.

7. The method as claimed in claim 1, wherein the electronic integrated circuit is formed between the high performance integrated circuit and the photonic integrated circuit.

8. A method of forming a semiconductor package, comprising:
    forming a photonic integrated circuit comprising a first optical dielectric waveguide;
    forming a second optical dielectric waveguide on the first optical dielectric waveguide, wherein the second optical dielectric waveguide is exposed;
    forming a laser die, wherein the laser die is optically coupled to the photonic integrated circuit; and
    forming an electronic integrated circuit to electrically connect to the photonic integrated circuit.

9. The method as claimed in claim 8, wherein a method of forming the photonic integrated circuit comprising the first optical dielectric waveguide comprises:
    forming a passivation layer over a substrate;
    forming an opening in the passivation layer; and
    forming a first optical dielectric waveguide in the opening.

10. The method as claimed in claim 8, before forming the second optical dielectric waveguide, further comprising forming a molding compound to encapsulate the photonic integrated circuit.

11. The method as claimed in claim 8, further comprising forming a redistribution structure between the photonic integrated circuit and the laser die, wherein a top surface of the second optical dielectric waveguide is higher than or substantially flush with a top surface of the redistribution structure.

12. The method as claimed in claim 8, further comprising:
forming a redistribution structure over the photonic integrated circuit and the second optical dielectric waveguide; and
forming the laser die over the redistribution structure.

13. The method as claimed in claim 8, further comprising:
providing a package substrate comprising an opening;
bonding the photonic integrated circuit, the electronic integrated circuit and the laser die onto the package substrate, wherein the laser die is inserted into the opening.

14. The method as claimed in claim 8, further comprising forming a high performance integrated circuit to electrically connect to the electronic integrated circuit.

15. A method of forming a semiconductor package, comprising:
forming a photonic integrated circuit;
forming a laser die over the photonic integrated circuit;
forming an electronic integrated circuit to electrically connected to the photonic integrated circuit; and
forming a redistribution structure between the photonic integrated circuit and the laser die, the redistribution structure comprising an optical dielectric layer optically coupling the laser die and the photonic integrated circuit.

16. The method as claimed in claim 15, wherein the redistribution structure is formed between the photonic integrated circuit and the electronic integrated circuit.

17. The method as claimed in claim 15, further comprising forming a package substrate, wherein the redistribution structure is disposed between the package substrate and the photonic integrated circuit and the electronic integrated circuit.

18. The method as claimed in claim 17, wherein the package substrate comprises an opening, and the laser die is disposed in the opening.

19. The method as claimed in claim 15, further comprising forming a light coupler disposed over the photonic integrated circuit, wherein the optical dielectric layer is disposed between and optically coupling the photonic integrated circuit and the light coupler.

20. The method as claimed in claim 15, further comprising forming a high performance integrated circuit to electrically connect to the electronic integrated circuit.

\* \* \* \* \*